US008736197B2

(12) United States Patent
Datta et al.

(10) Patent No.: US 8,736,197 B2
(45) Date of Patent: May 27, 2014

(54) METHODS AND APPARATUS FOR CONTROLLING RESPECTIVE LOAD CURRENTS OF MULTIPLE SERIES-CONNECTED LOADS

(75) Inventors: Michael Datta, Boston, MA (US); Ihor Lys, Milton, MA (US)

(73) Assignee: Koninklijke Philips N.V., Eindhoven (NL)

( * ) Notice: Subject to any disclaimer, the term of this patent is extended or adjusted under 35 U.S.C. 154(b) by 1083 days.

(21) Appl. No.: 12/681,631

(22) PCT Filed: Oct. 8, 2008

(86) PCT No.: PCT/US2008/079202
§ 371 (c)(1),
(2), (4) Date: Oct. 28, 2010

(87) PCT Pub. No.: WO2009/048951
PCT Pub. Date: Apr. 16, 2009

(65) Prior Publication Data
US 2011/0031888 A1    Feb. 10, 2011

Related U.S. Application Data

(60) Provisional application No. 60/978,612, filed on Oct. 9, 2007.

(51) Int. Cl.
*H05B 37/02*    (2006.01)
(52) U.S. Cl.
USPC ......... 315/309; 315/291; 315/185 S; 315/294
(58) Field of Classification Search
USPC ......... 315/122, 119, 121, 247, 246, 248, 249, 315/260, 267, 287, 185 S, 291, 307–326, 315/294, 297; 362/227, 230, 234, 249.01, 362/249.07, 249.12, 249.13, 253
See application file for complete search history.

(56) References Cited

U.S. PATENT DOCUMENTS 6,441,558 B1 * 8/2002 Muthu et al. ................... 315/149
6,777,891 B2    8/2004 Lys et al.
(Continued)

FOREIGN PATENT DOCUMENTS

EP    1589519 A2    10/2005
WO    0247438 A2    6/2002
WO    2009048956 A2    4/2009

OTHER PUBLICATIONS

Adragna: "L6561, Enhanced Transition Mode Power Factor Corrector"; St Microelectronics Application Note AN966, Mar. 2003, 21 Page Document.

(Continued)

*Primary Examiner* — Daniel Cavallari
*Assistant Examiner* — Borna Alaeddini
(74) *Attorney, Agent, or Firm* — Mark L. Beloborodov

(57) ABSTRACT

A lighting apparatus (100) includes one or more first LEDs (202) for generating a first spectrum of radiation (503), and one or more second LEDs (204) for generating a second different spectrum radiation (505). The first and second LEDs are electrically connected in series between a first node (516A) and a second node (516B), between which a series current (550) flows with the application of an operating voltage (516) across the nodes. A controllable current path (518) is connected in parallel with one or both of the first and second LEDs so as to at least partially divert the series current, such that a first current (552) through the first LED(s) and a second current (554) through the second LED(s) are different. Such current diversion techniques may be employed to compensate for shifts in color or color temperature of generated light during thermal transients, due to different temperature-dependent current-to-flux relationships for different types of LEDs.

19 Claims, 8 Drawing Sheets

(56) References Cited

U.S. PATENT DOCUMENTS

| | | | |
|---|---|---|---|
| 7,723,926 B2* | 5/2010 | Mednik et al. | 315/291 |
| 2004/0105264 A1* | 6/2004 | Spero | 362/276 |
| 2005/0218838 A1 | 10/2005 | Lys | |
| 2006/0038803 A1* | 2/2006 | Miller et al. | 345/204 |
| 2007/0108916 A1* | 5/2007 | Wang et al. | 315/247 |
| 2008/0122376 A1 | 5/2008 | Lys | |
| 2008/0278092 A1 | 11/2008 | Lys et al. | |

OTHER PUBLICATIONS

Salati: "Switching From the L6561 to the L6562"; St Microelectronics Application Note AN1757, Apr. 2004, 9 Page Document.

Adragna et al: "Flyback Converters With the L6561 PFC Controller"; St Microelectronics Application Note AN1060, Jan. 2003, 11 Page Document.

Adragna: "Design Equations of High-Power-Factor Flyback Converters Based on the L6561"; St Microelectronics Application Note AN 1059, Sep. 2003, 20 Page Document.

Adragna: "L6561-Based Switcher Replaces Mag Amps in Silver Boxes"; St Microelectronics Application Note AN1007, Oct. 2003, 6 Page Document.

Adragna: "Design of Fixed-Off-Time-Controlled PFC Pre-Regulators With the L6562"; St Microelectronics Application Note AN 1792, Nov. 2003, 30 Page Document.

* cited by examiner

METHODS AND APPARATUS FOR CONTROLLING RESPECTIVE LOAD CURRENTS OF MULTIPLE SERIES-CONNECTED LOADS

CROSS-REFERENCE TO RELATED APPLICATIONS

The present application claims the benefit of U.S. Provisional Application Ser. No. 60/978,612, entitled "Integrated LED-Based Luminaire for General Lighting," filed on Oct. 9, 2007, which is incorporated herein by reference in its entirety.

STATEMENT OF GOVERNMENTAL INTEREST

This invention was made with governmental support under grant number DE-DE-FC26-06NT42932 awarded by the U.S. Department of Energy. The U.S. Government has certain rights in the invention.

BACKGROUND

Series-connected loads, i.e. multiple electrically conducting devices connected so as to receive the electric current in series, have found recent applicability in the solid-state lighting. Light emitting diodes (LEDs) are semiconductor-based light sources often employed in low-power instrumentation and appliance applications for indication purposes. LEDs conventionally are available in a variety of colors (e.g., red, green, yellow, blue, white), based on the types of materials used in their fabrication. This color variety of LEDs, coupled with advances in the development and improvements of the luminous flux of light-emitting devices, recently has been exploited to create novel LED-based light sources having sufficient light output for new space-illumination applications.

For example, U.S. Pat. No. 6,777,891 contemplates arranging a plurality of LED-based lighting units as a computer-controllable "light string," wherein each lighting unit constitutes an individually-controllable "node" of the light string. Applications suitable for such light strings include decorative and entertainment-oriented lighting applications (e.g., Christmas tree lights, display lights, theme park lighting, video and other game arcade lighting, etc.). Via computer control, one or more such light strings provide a variety of complex temporal and color-changing lighting effects. In many implementations, lighting data is communicated to one or more nodes of a given light string in a serial manner, according to a variety of different data transmission and processing schemes, while power is provided in parallel to respective lighting units of the string (e.g., from a rectified high voltage source, in some instances with a substantial ripple voltage).

The operating voltage required by each lighting unit (as well as the string, due to the parallel power interconnection of lighting units) typically is related to the forward voltage of the LEDs in each lighting unit (e.g., from approximately 2 to 3.5 Volts depending on the type/color of LED), how many LEDs are employed for each "color channel" of the lighting unit and how they are interconnected, and how respective color channels are organized to receive power from a power source. For example, the operating voltage for a lighting unit having a parallel arrangement of respective color channels to receive power, each channel including one LED having a forward voltage on the order of 3 Volts and corresponding circuitry to provide current to the channel, may be on the order of 4 to 5 Volts, which is applied in parallel to all channels to accommodate the one LED and current circuitry in each channel. Accordingly, in many applications, some type of voltage conversion device is desirable in order to provide a generally lower operating voltage to one or more LED-based lighting units from more commonly available higher power supply voltages (e.g., 12 VDC, 15 VDC, 24 VDC, a rectified line voltage, etc.).

One impediment to widespread adoption of low-voltage LEDs and low-voltage LED-based lighting units as light sources in applications in which generally higher power supply voltages are readily available is the need to convert energy from one voltage to another, which, in many instances, results in conversion inefficiency and wasted energy. Furthermore, energy conversion typically involves power management components of a type and size that generally impede integration. Conventionally, LEDs are provided as single LED packages, or multiple LEDs connected in series or parallel in one package. One significant barrier to the integration of LEDs and power conversion circuitry relates to the type and size of power management components needed to convert energy to the relatively lower voltage levels typically required to drive LEDs.

In view of the foregoing, other recent applications involving LEDs, as discussed for example in U.S. Patent Application Publication No. 2008-0122376-A1, are directed to a series interconnection of multiple LEDs to permit the use of operating voltages that are significantly higher than typical LED forward voltages, and also allow operation of multiple LEDs or LED-based lighting units without requiring a transformer between a source of power (e.g., wall power or line voltage such as 120 VAC or 240 VAC) and the loads (i.e., multiple series-connected loads may be operated "directly" from a line voltage).

SUMMARY

Applicants have recognized and appreciated that control of multiple series-connected loads, such as LED light sources, enables a number of lighting applications, in which highly efficient and particularly tailored power supplies may be integrated with light sources in a luminaire configured to provide variable colored or essentially white light. Applicants have also recognized and appreciated that specific control aspects, especially control of current to respective ones of multiple series-connected loads, can facilitate various operating characteristics of such luminaires and, in particular, compensation for drifts in color or color temperature of generated light as a function of thermal transients.

Accordingly, one aspect of the present invention is directed to a lighting apparatus, including at least one first LED for generating first radiation having a first spectrum, and at least one second LED for generating second radiation having a second spectrum different from the first spectrum. The at least one first LED and the at least one second LED are electrically connected in series between a first node and a second node. A series current flows between the first node and the second node when an operating voltage is applied across the first node and the second node. A switching power supply provides power factor correction and the operating voltage. The switching power supply controls at least one controllable current path connected in parallel with one of the at least one first LED and the at least one second LED so as to at least partially divert the series current around the one of the at least one first LED and the at least one second LED, such that a first current through the at least one first LED and a second current through the at least one second LED are different.

Another aspect of the present invention is directed to a method for controlling a color temperature of white light generated by an LED-based lighting apparatus during a thermal transient. The LED-based lighting apparatus includes at least one first LED for generating first radiation having a first spectrum and at least one second LED for generating second radiation having a second spectrum different from the first spectrum, wherein the white light results from a mixture of the first radiation and the second radiation. The at least one first LED and the at least one second LED are electrically connected in series between a first node and a second node, and a series current flows between the first node and the second node when an operating voltage is applied across the first node and the second node. The method includes the steps of generating a temperature signal representing a temperature proximate to the at least one first LED and the at least one second LED; and controlling, based on the temperature signal, at least one controllable current path connected in parallel with one of the at least one first LED and the at least one second LED so as to at least partially divert the series current around the one of the at least one first LED and the at least one second LED, such that a first current through the at least one first LED and a second current through the at least one second LED are different.

Another aspect of the present invention is directed to an apparatus for controlling a color temperature of white light generated by an LED-based light source during a thermal transient. The LED-based light source is mounted to a thermally conductive substrate, and the thermally conductive substrate has a recess formed therein proximate to the LED-based light source. The apparatus includes a printed circuit board having a tab for insertion into the recess formed in the thermally conductive substrate. The apparatus further comprises a temperature sensor disposed on the tab of the printed circuit board, such that when the printed circuit board is inserted into the recess formed in the thermally conductive substrate, the temperature sensor is essentially embedded in the thermally conductive substrate proximate to the LED-based light source. The apparatus further comprises a plurality of components disposed on the printed circuit board and constituting a switching power supply for providing power factor correction and an operating voltage for the LED-based light source, the switching power supply comprising at least one integrated circuit (IC) controller.

As used herein for purposes of the present disclosure, the term "LED" should be understood to include any electroluminescent diode or other type of carrier injection/junction-based system that is capable of generating radiation in response to an electric signal. Thus, the term LED includes, but is not limited to, various semiconductor-based structures that emit light in response to current, light emitting polymers, organic light emitting diodes (OLEDs), electroluminescent strips, and the like.

In particular, the term LED refers to light emitting diodes of all types (including semiconductor and organic light emitting diodes) that may be configured to generate radiation in one or more of the infrared spectrum, ultraviolet spectrum, and various portions of the visible spectrum (generally including radiation wavelengths from approximately 400 nanometers to approximately 700 nanometers). Some examples of LEDs include, but are not limited to, various types of infrared LEDs, ultraviolet LEDs, red LEDs, blue LEDs, green LEDs, yellow LEDs, amber LEDs, orange LEDs, and white LEDs (discussed further below). It also should be appreciated that LEDs may be configured and/or controlled to generate radiation having various bandwidths (e.g., full widths at half maximum, or FWHM) for a given spectrum (e.g., narrow bandwidth, broad bandwidth), and a variety of dominant wavelengths within a given general color categorization.

The term "spectrum" should be understood to refer to any one or more frequencies (or wavelengths) of radiation produced by one or more light sources. Accordingly, the term "spectrum" refers to frequencies (or wavelengths) not only in the visible range, but also frequencies (or wavelengths) in the infrared, ultraviolet, and other areas of the overall electromagnetic spectrum. Also, a given spectrum may have a relatively narrow bandwidth (e.g., a FWHM having essentially few frequency or wavelength components) or a relatively wide bandwidth (several frequency or wavelength components having various relative strengths). It should also be appreciated that a given spectrum may be the result of a mixing of two or more other spectra (e.g., mixing radiation respectively emitted from multiple light sources). For purposes of this disclosure, the term "color" is used interchangeably with the term "spectrum." However, the term "color" generally is used to refer primarily to a property of radiation that is perceivable by an observer (although this usage is not intended to limit the scope of this term). Accordingly, the terms "different colors" implicitly refer to multiple spectra having different wavelength components and/or bandwidths. It also should be appreciated that the term "color" may be used in connection with both white and non-white light.

The term "color temperature" generally is used herein in connection with white light, although this usage is not intended to limit the scope of this term. Color temperature essentially refers to a particular color content or shade (e.g., reddish, bluish) of white light. The color temperature of a given radiation sample conventionally is characterized according to the temperature in degrees Kelvin (K) of a black body radiator that radiates essentially the same spectrum as the radiation sample in question. Black body radiator color temperatures generally fall within a range of from approximately 700 degrees K (typically considered the first visible to the human eye) to over 10,000 degrees K; white light generally is perceived at color temperatures above 1500-2000 degrees K.

Lower color temperatures generally indicate white light having a more significant red component or a "warmer feel," while higher color temperatures generally indicate white light having a more significant blue component or a "cooler feel." By way of example, fire has a color temperature of approximately 1,800 degrees K, a conventional incandescent bulb has a color temperature of approximately 2848 degrees K, early morning daylight has a color temperature of approximately 3,000 degrees K, and overcast midday skies have a color temperature of approximately 10,000 degrees K. A color image viewed under white light having a color temperature of approximately 3,000 degree K has a relatively reddish tone, whereas the same color image viewed under white light having a color temperature of approximately 10,000 degrees K has a relatively bluish tone.

The term "controller" is used herein generally to describe various apparatus relating to the operation of one or more light sources. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

In various implementations, a processor or controller may be associated with one or more storage media (generically referred to herein as "memory," e.g., volatile and non-volatile computer memory such as RAM, PROM, EPROM, and 5PROM, floppy disks, compact disks, optical disks, magnetic tape, etc.). In some implementations, the storage media may be encoded with one or more programs that, when executed on one or more processors and/or controllers, perform at least some of the functions discussed herein. Various storage media may be fixed within a processor or controller or may be transportable, such that the one or more programs stored thereon can be loaded into a processor or controller so as to implement various aspects of the present disclosure discussed herein. The terms "program" or "computer program" are used herein in a generic sense to refer to any type of computer code (e.g., software or microcode) that can be employed to program one or more processors or controllers.

It should be appreciated that all combinations of the foregoing concepts and additional concepts discussed in greater detail below (provided such concepts are not mutually exclusive) are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

Figure 1:
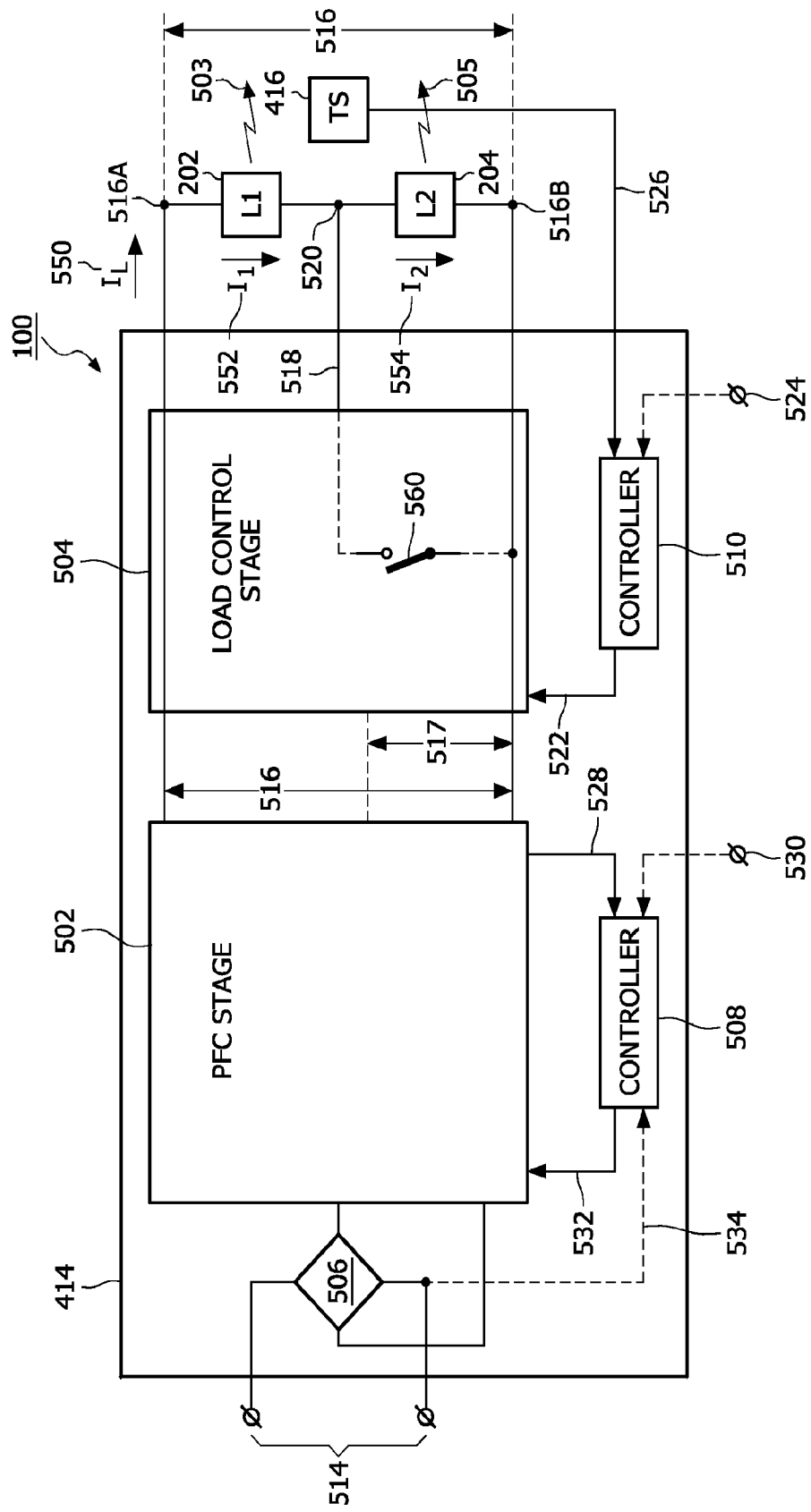
FIG. 1 is a generalized block diagram illustrating various electrical components of a power supply for multiple series-connected loads, according to one embodiment of the present invention.

FIG. 1 is a generalized block diagram illustrating various electrical components of an apparatus 100 for controlling respective load currents of multiple series-connected loads, according to one embodiment of the present invention. In one exemplary implementation discussed in detail herein, the apparatus may be a luminaire comprising multiple series-connected LED loads to provide colored and/or white light having a variety of colors and/or correlated color temperatures. It should be appreciated that, more generally, an apparatus according to one embodiment of the invention as depicted in FIG. 1 is not limited in this respect, and that different types of loads and different types of applications (in some cases not necessarily related to lighting) are contemplated by the present disclosure. It also should be appreciated that some of the electrical components illustrated in FIG. 1 are optional, and that not all components need necessarily be present in various inventive embodiments of methods and apparatus according to the present disclosure.

As shown in FIG. 1, the apparatus 100, as exemplified by a luminaire employing multiple LED light sources, includes a power supply and control electronics 414 that receives an A.C. input voltage 514 and provides an operating voltage 516 for the LED light sources. In FIG. 1, two different types of LED light sources are shown constituting multiple series-connected loads, namely, one or more first LEDs 202 for generating first radiation 503 having a first spectrum, and one or more second LEDs 204 for generating second radiation 505 having a second spectrum different from the first spectrum (for simplicity in FIG. 1, the one or more first LEDs are shown in a block labeled L1 and the one or more second LEDs are shown in a block labeled L2).

In one non-limiting exemplary implementation, the first LED(s) 202 may include one or more red LEDs for generating a first spectrum of radiation including essentially monochromatic red light, and the second LED(s) may include one or more white LEDs (e.g., a blue LED irradiating a phosphor) for generating a second spectrum of radiation including relatively broadband white light. Light generated by the luminaire results from a mixture of the first radiation 503 and the second radiation 505 when both are present. In one specific example, a relatively smaller number of red LEDs (e.g., six) are employed with a relatively larger number of white LEDs (e.g., twenty) in the luminaire to provide a particular correlated color temperature of white light (e.g., approximately 2800 to 3000 Kelvin) and a relatively high color rendering index (e.g., CRI of approximately 85-90).

In FIG. 1, the first LED(s) 202 and the second LED(s) 204 are electrically connected in series between a first node 516A and a second node 516B. When the power supply 414 provides the operating voltage 516, a series current 550 ($I_L$) flows between the first node and the second node.

As shown in the block diagram of FIG. 1, the power supply and control electronics 414 (hereinafter "power supply") may be a multi-stage switching power supply for providing both power factor correction and the operating voltage 516. More specifically, the power supply 414 may include a power factor correction stage 502 for receiving the A.C. input voltage 514 via a bridge rectifier 506 and providing the power factor correction and the operating voltage 516. Due to the high power factor correction provided by the power factor correction stage 502, the luminaire/apparatus 100 appears as an essentially resistive element to the applied input voltage 514.

The power supply 414 may also include a load control stage 504 to control a flow of the series current 550 between the nodes 516A and 516B. In particular, as illustrated in FIG. 1, the load control stage 504 includes a controllable current path 518 (including switch 560), coupled to a node 520 between the first LED(s) 202 and the second LED(s) 204 and connected in parallel with the second LED(s) 204, so as to at least partially divert the series current 550 around the second LED(s) 204. In one aspect, the current path 518 may be controlled such that a first current 552 ($I_1$) through the first LED(s) and a second current 554 ($I_2$) through the second LED(s) are different. Such control of the respective currents $I_1$ and $I_2$ through the first LED(s) and the second LED(s) facilitates setting and adjusting a color or color temperature of the light generated by the luminaire. In one aspect of an exemplary implementation discussed in detail below, a portion of the second current that is diverted from the second LED(s) may be "recycled" and added to the first current.

While FIG. 1 specifically illustrates the controllable current path 518 of the load control stage 504 in parallel with the second LED(s), it should be nonetheless appreciated that one or more controllable current paths may be employed in the load control stage 504, parallel to either or both of the first LED(s) 202 and the second LED(s) 204, for diverting at least a portion of the series current 550 around either or both of the first LED(s) and the second LED(s). As also shown in FIG. 1, the load control stage 504 may receive from the power factor correction stage 502 a voltage 517 different than the operating voltage 516 for facilitating control of the switch 560 in the controllable current path 518 as well as other components in the load control stage 504, as discussed further below.

In another aspect of the embodiment shown in FIG. 1, the apparatus/luminaire 100 may further include one or more temperature sensors 416 (TS) disposed proximate to and in thermal communication with the first LED(s) 202 and the second LED(s) 204. Additionally, the power supply 414 may include a controller 510, associated with at least the load control stage 504, for receiving a temperature signal 526 provided by the temperature sensor(s) 416. As also shown in FIG. 1, the controller 510 may receive one or more external signals 524 instead of or in addition to the temperature signal 526. In one aspect, the controller 510 provides a control signal 522 to the load control stage 504 for controlling the controllable current path 518 (i.e., controlling the switch 560), based at least in part on the temperature signal 526 and/or the external signal 524. In this manner, control over one or both of the first current 552 (through the first LED(s) 202) and the second current 554 (through the second LED(s) 204) may be a function of temperature changes over time in the vicinity of the LED sources (via the temperature signal 526), and/or any number of external parameters (via the external signal 524). As discussed in greater detail below in connection with FIG. 5, the ability to vary one or both of the first and second currents as a function of LED temperature significantly mitigates undesirable variations in color or color temperature of light provided by the luminaire during thermal transients (e.g., as the LEDs warm-up over some period of time to a thermal steady state following power-on of the luminaire).

In yet another aspect of the embodiment shown in FIG. 1, the power supply 414 may include a second controller 508 coupled to the power factor correction stage 502. The controller 508 provides a control signal 532 to the power factor correction stage 502 so as to control the operating voltage 516 and/or a power provided by the power factor correction stage based on any of a variety of parameters. To this end, the controller 508 may receive as inputs a first signal 528 representing at least one voltage or current associated with the power factor correction stage 502, a second signal 534 representing a frequency of the A.C. input voltage 514, or an external signal 530. In particular, internal timing of the controller 508 may be "line-driven" via the second signal 534 (allowing accurate timing features through the use of a 50 Hz or 60 Hz A.C. line voltage reference).

It should be appreciated that while both a controller 508 associated with the power factor correction stage 502 and a controller 510 associated with the load control stage 504 are shown in the power supply 414 of FIG. 1, one or both of the controllers 508 and 510 constitute optional features that need not be present in various implementations of the apparatus/luminaire 100 according to the present disclosure. Additionally, in some inventive embodiments, a single controller may be employed to provide one or more control signals to both the power factor correction stage 502 and the load control stage 504 so as to implement the various functionalities discussed herein in connection with these respective stages.

Figure 2:
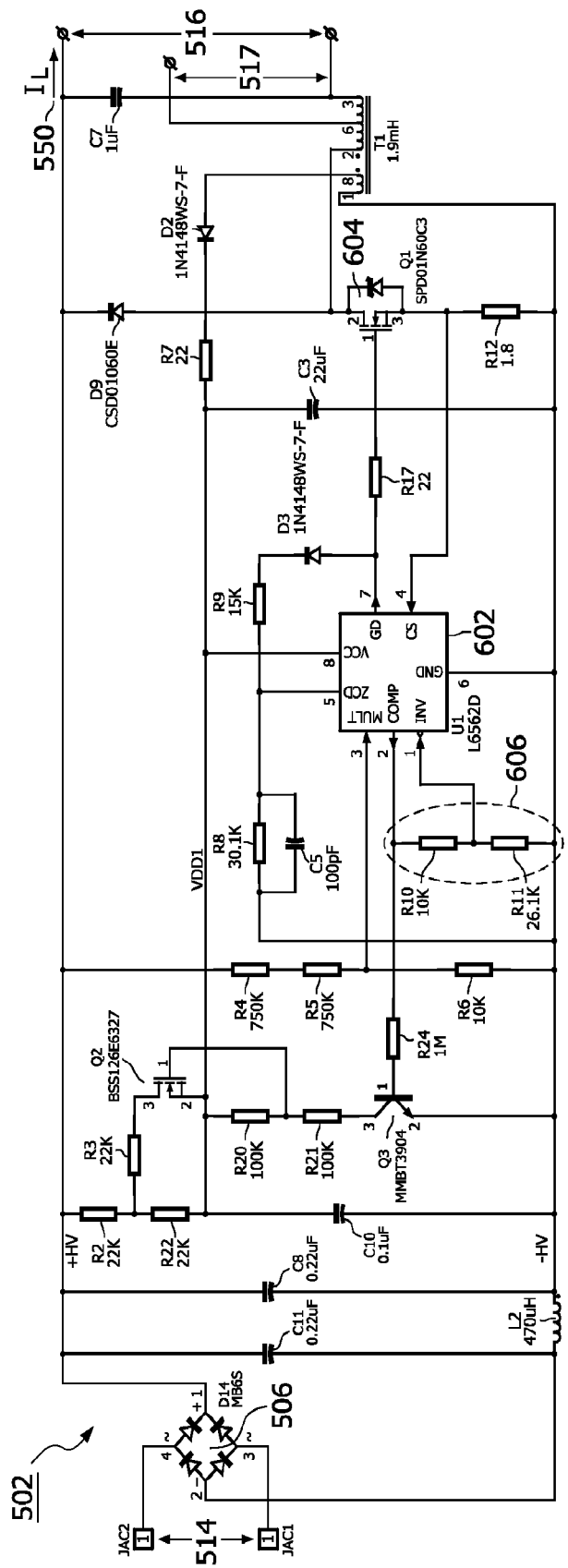
FIG. 2 is a circuit diagram illustrating a power factor correction stage of the power supply shown in FIG. 1, according to one embodiment of the present invention.

FIG. 2 is a circuit diagram illustrating details of the power factor correction stage 502 of the power supply 414 shown in FIG. 1, according to one embodiment of the present invention. The general architecture of the circuit shown in FIG. 2 is based on the integrated circuit power factor correction controller 602 (U1), and various circuits based on this general architecture are discussed in detail in U.S. non-provisional application Ser. No. 12/113,320, filed May 1, 2008, entitled "High Power Factor LED-based Lighting Apparatus and Methods," which application is hereby incorporated herein by reference.

More specifically, the power factor correction stage 502 employs a power factor correction controller 602 exemplified by the ST Microelectronics L6562 controller. In some conventional applications, the L6562 controller and the related ST Microelectronics L6561 controller utilize a "transition mode" (TM) technique (i.e., operating around a boundary between continuous and discontinuous modes) commonly employed for power factor correction in relatively low power applications. Details of the L6561 controller and the transition mode technique are discussed in ST Microelectronics Application Note AN966, "L6561 Enhanced Transition Mode Power Factor Corrector," by Claudio Adragna, March 2003, available at http://www.st.com and incorporated herein by reference. Differences between the L6561 and L6562 controllers are discussed in ST Microelectronics Application Note AN1757, "Switching from the L6561 to the L6562," by Luca Salati, April 2004, also available at http://www.st.com and incorporated herein by reference. For purposes of the present disclosure, these two controllers generally are discussed as having similar functionality.

In addition to facilitating power factor correction, the ST Microelectronics L6561 and L6562 controllers may be alternatively employed in a "non-standard" configuration as a controller in a flyback DC-DC converter implementation. Details of this and related alternative applications of the L6561/L6562 controllers are discussed in ST Microelectronics Application Note AN1060, "Flyback Converters with the L6561 PFC Controller," by C. Adragna and G. Garravarik, January 2003, ST Microelectronics Application Note AN1059, "Design Equations of High-Power-Factor Flyback Converters based on the L6561," by Claudio Adragna, September 2003, and ST Microelectronics Application Note AN1007, "L6561-based Switcher Replaces Mag Amps in Silver Boxes," by Claudio Adragna, October 2003, each of which is available at http://www.st.com and incorporated herein by reference.

Specifically, Application Notes AN1059 and AN1060 discuss one exemplary configuration for an L6561-based flyback converter (High-PF flyback configuration) that operates in transition mode and exploits the aptitude of the L6561 controller for performing power factor correction, thereby providing a high power factor single switching stage DC-DC converter for relatively low load power requirements (e.g., up to approximately 30 Watts). The flyback converter configuration requires a voltage regulation feedback control loop, which receives as an input a sample of the DC output voltage provided by the converter and provides as feedback an error signal which is applied to the INV input of the L6561 controller.

ST Microelectronics Application Note AN1792, entitled "Design of Fixed-Off-Time-Controlled PFC Pre-regulators with the L6562," by Claudio Andragna, November 2003, available at http://www.st.com and incorporated herein by reference, discloses another approach for controlling a power factor corrector pre-regulator as an alternative to the transition mode method and the fixed frequency continuous conduction mode method. Specifically, a "fixed-off-time" (FOT) control method may be employed with the L6562 controller, for example, in which only the on-time of a pulse width modulated signal is modulated, and the off-time is kept constant (leading to a modulation in switching frequency). Like the transition mode approach, the fixed-off-time (FOT) control method conventionally contemplated using the L6562 controller similarly requires a voltage regulation feedback control loop.

As can be seen from FIG. 2, unlike the conventional applications for the L6561 and L6562 controller discussed above, the power factor correction stage 502 does not require any feedback control loop to regulate the operating voltage 516, thereby simplifying the circuit design as compared to conventional implementations. In particular, Applicants have recognized and appreciated that for implementations involving essentially fixed/stable load power requirements, a voltage regulation feedback control loop is not necessary to achieve effective operation. Specifically, loads involving light emitting diodes (LEDs) themselves are essentially voltage regulation devices, in that a single LED or multiple LEDs interconnected in various series, parallel, or series/parallel configurations dictates a particular voltage across the load. Hence, the power factor correction stage 502 may be reliably configured to provide an appropriately stable operating voltage 516 and power to the LED load without requiring a feedback control loop.

In the circuit diagram of FIG. 2, the power factor correction stage 502 is based on a buck type DC-DC converter configuration, in which the power factor correction controller 602 controls a switch 604 (implemented by transistor Q1) which in turn dictates an energy storage and release cycle for an inductor (provided by one of the windings of transformer T1). More specifically, during the intervals in which the transistor switch 604 is "on" or closed (i.e., applying a voltage across the transformer winding serving as the inductor), current flows through the inductor based on the applied voltage and the inductor stores energy in its magnetic field. When the switch is turned "off" or opened (i.e., voltage is removed from the inductor), the energy stored in the inductor is transferred via diode D9 to a filter capacitor C7, across which is provided the operating voltage 516 (i.e., the capacitor provides essentially continuous energy between inductor energy storage cycles).

The power factor correction stage 502 may be configured for a variety of different input voltages 514, operating voltages 516, and load series current 550 ($I_L$) based on an appropriate selection of various circuit components. In particular, the resistor divider network 606 formed by R10 and R11 substantially determines the series current 550 through the load, given that the type and number of series-connected LEDs constituting the load essentially determines the target operating voltage. In the particular circuit example shown in FIG. 2, the circuit is configured to accept an input voltage of 120 Volts RMS, and provide an operating voltage on the order of 80 Volts with a series current 550 on the order of 150 milliamperes. In one aspect of the circuit shown in FIG. 2, the power factor correction controller 602 is configured to employ the fixed-off time (FOT) control technique to control the switch 604 (Q1). The FOT control technique permits the use of a relatively smaller transformer T1 for the buck configuration. This allows the transformer to be operated at a more constant frequency, which in turn delivers higher power to the load for a given core size.

In some exemplary implementations, the A.C. input voltage 514 may be derived from an output of an A.C. dimmer (which in turn receives as an input an A.C. line voltage). In various aspects, the voltage 514 provided by the A.C. dimmer may be a voltage amplitude controlled or duty-cycle (phase) controlled A.C. voltage, for example. In one exemplary implementation, by varying an RMS value of the A.C. voltage 514 applied to the power supply 414 via the A.C. dimmer, the operating voltage 516 (and in turn the series current 550) may be similarly varied; thus, the A.C. dimmer may be employed to vary an overall brightness of light generated by the luminaire.

Figure 3:
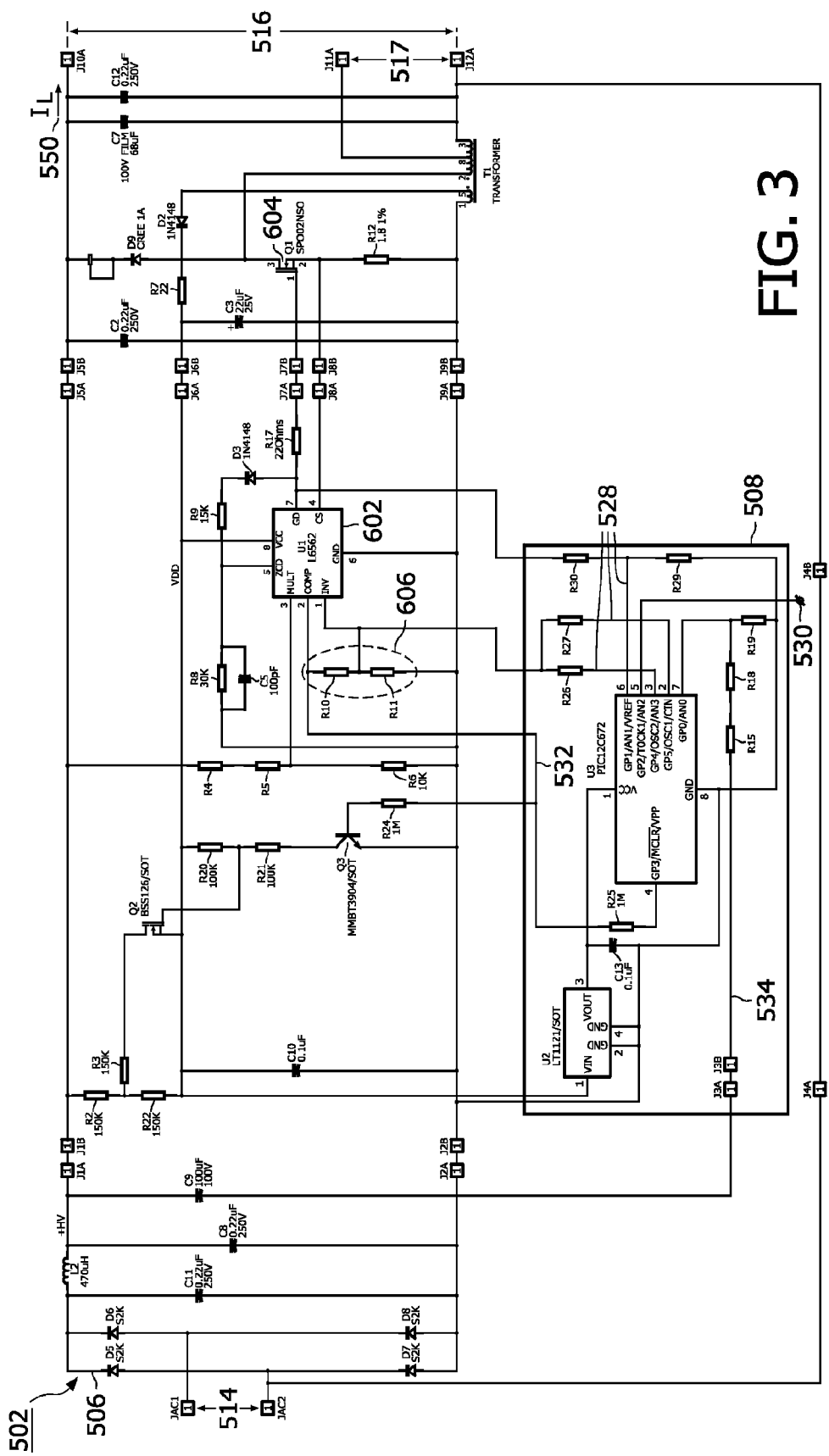
FIG. 3 is a circuit diagram illustrating the power factor correction stage of the power supply shown in FIG. 1, together with an associated controller, according to one embodiment of the present invention.

FIG. 3 is a circuit diagram illustrating the power factor correction stage 502 of the power supply 414 shown in FIG. 1, together with an associated controller 508, according to another embodiment of the present invention. The power factor correction stage 502 shown in FIG. 3 is substantially similar to the one shown in FIG. 2 in many salient respects, although some particular component values may be different to illustrate the possibility of different operating parameters (e.g., input voltage, operating voltage, current). As discussed above in connection with FIG. 1, an optional controller 508 may be employed in association with the power factor correction stage 502 to provide a control signal 532, applied to the resistor divider network 606, so as to control the operating voltage 516 and/or series current 550, and thus the power, provided by the power factor correction stage. The controller 508 may generate the control signal 532 based on any one of a variety of parameters provided as inputs to the controller 508. As discussed further below in connection with FIG. 5, in one exemplary implementation the control signal 532 provided by the controller 508 may be a pulse-width modulated (PWM) control signal, the duty cycle of which affects the voltages established by the resistor divider network 606; hence, by varying the duty cycle of a PWM control signal 532, the operating voltage 516 and/or the series current 550 provided by the power factor correction stage 502 may be varied by the controller 508.

With respect to parameters in response to which the controller 508 may vary the control signal 532, as shown in FIG. 3 the controller 508 may receive one or more inputs 528 representing at least one voltage or current associated with the power factor correction stage 502 (e.g., pin 6 of the IC U3 is coupled to receive the signal controlling the switch Q1, and pins 2 and 3 of U3 are coupled to a voltage associated with the resistor divider network 606). In this manner, the controller 508 may serve a feedback control function and provide the control signal 532 in response to any one of a number of monitored circuit parameters associated with the power factor correction stage 502.

The controller 508 also may receive a signal 534 representing a frequency of the A.C. input voltage 514 (applied to pin 7 of IC U3 via the resistor divider network formed by R15, R18 and R19). In particular, internal timing of the controller 508 may be "line-driven" via the signal 534, allowing accurate timing features through the use of a 50 Hz or 60 Hz A.C. line voltage reference. In one exemplary application, the controller 508 may maintain a cycle count (e.g. monitor zero-crossings) of the A.C. input voltage 514 via the signal 534 as a metric for "time in operation" of the LED light sources constituting the load. In turn, the controller 508 may adjust operating parameters of the power factor correction stage via the control signal 532 based on the time of operation to compensate for aging effects associated with LEDs (e.g., increasing the operating voltage 516 and/or the series current 550 to compensate for lower efficiency/reduced flux of aging LEDs). Alternatively or in addition to adjusting operating parameters of the power factor correction stage to compensate for aging effects, the controller 508 may use the information associated with "time in operation" of the LED light sources to provide some indication of "lamp life remaining." For example, the controller 508 may provide a control signal 532 that modulates the power provided to the LED load to visibly affect the generated light (e.g., intentionally blink or modulate light brightness) so as to provide information relating to some condition (e.g., lamp age) via the intentionally modulated light.

Additionally, the controller 508 may receive one or more external signals 530 (e.g., applied to pin 5 of IC U3 in the example of FIG. 3) so that control of the power factor correction stage 502 may be based on any of a wide variety of external conditions (e.g., temperature conditions, ambient lighting conditions, other environmental conditions, over-voltage or load failure conditions, emergency conditions, motion, etc.). In response to one or more such external signals, the controller may provide a control signal 532 that adjusts one or more operating parameters of the power factor correction stage, and/or may modulate the power provided to the LED load so as to provide information relating to some condition represented by the external signal(s) via the intentionally modulated light.

Figure 4:
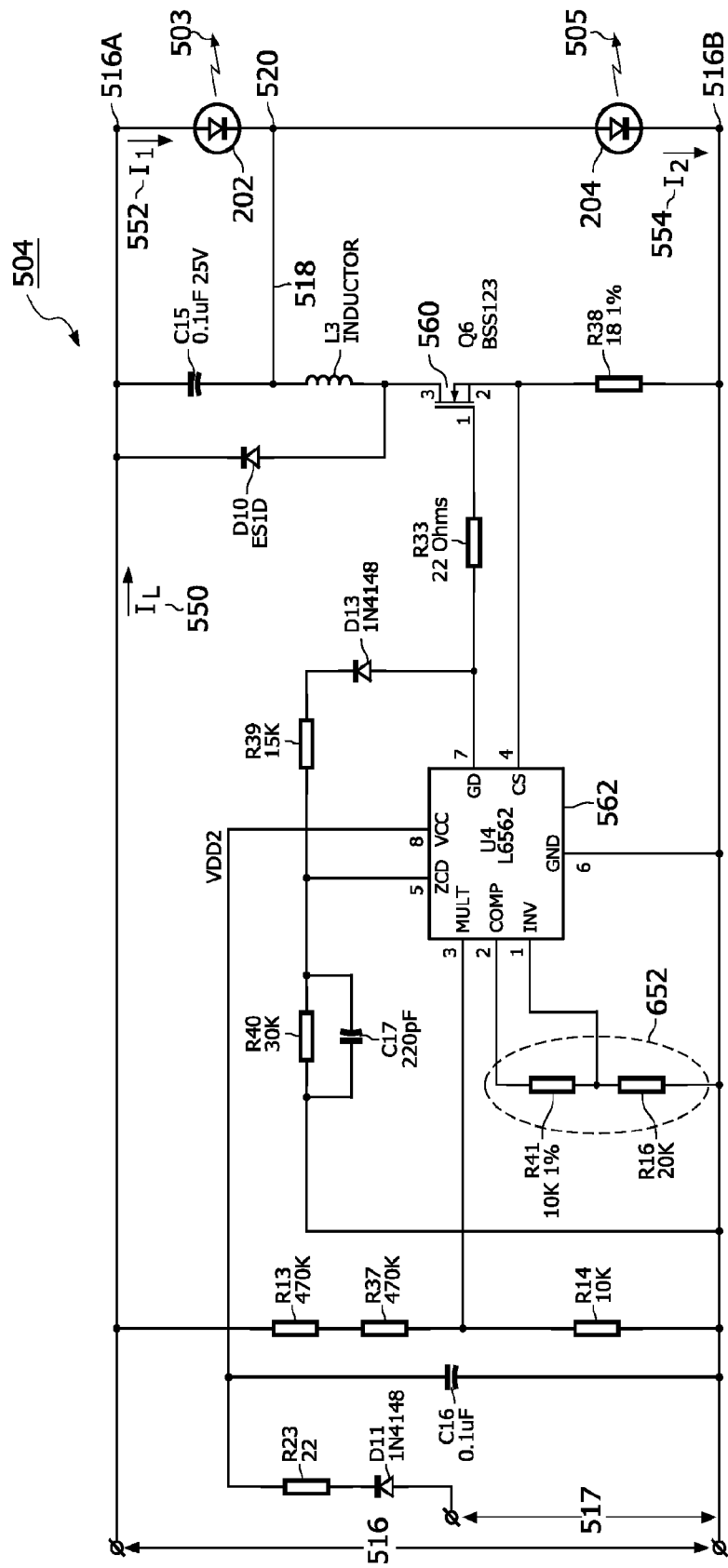
FIG. 4 is a circuit diagram illustrating a load control stage of the power supply shown in FIG. 1, according to one embodiment of the present invention.

FIG. 4 is a circuit diagram illustrating details of the load control stage 504 of the power supply 414 shown in FIG. 1, according to one embodiment of the present invention. Similar to the power factor correction stage 502, the general circuit architecture for the load control stage 504 shown in FIG. 4 is based on the ST Microelectronics L6562 integrated circuit controller, shown as IC U4, utilizing a fixed-off time (FOT) control technique and implemented in a buck converter configuration. In particular, the IC controller 562 constituted by U4 controls the switch 560 (implemented by transistor Q6) to in turn control the current path 518, in which also is disposed the inductor L3 as the energy storage/release device in the buck converter configuration.

As discussed above in connection with FIG. 1, in FIG. 4 the first LED(s) 202 and the second LED(s) 204 are connected in series between the nodes 516A and 516B, across which the operating voltage 516 is provided. The controllable current path 518 is coupled to the node 520 between the series-connected first LED(s) 202 and second LED(s) 204. While only a single LED is shown for purposes of illustration in FIG. 4 for each of the series-connected LED loads, as discussed above it should be appreciated that each of the LED loads 202 and 204 may include multiple LED light sources, connected in any of a variety of series, parallel, or series parallel arrangements, and may have different numbers of a given type of LED. In one exemplary implementation discussed herein, the first LED(s) 202 may include on the order of six series-connected red LEDs and the second LED(s) 204 may include on the order of 20 series-connected white LEDs. Given a forward operating voltage for a red LED on the order of 3.3 Volts, and a forward operating voltage for a white LED on the order of 3 Volts, an appropriate operating voltage 516 applied across the nodes 516A and 516B in this example would be on the order of 80 Volts (i.e., [3.3 Volts×6]+[3 Volts×20]).

Via control of the switch 560 and in turn the current path 518, the load control stage 504 of FIG. 4 controls a flow of the series current 550 between the nodes 516A and 516B. In particular, via operation of the switch 560, the series current 550 may be at least partially diverted around the second LED(s) 204, such that the first current 552 ($I_1$) through the first LED(s) and the second current 554 ($I_2$) through the second LED(s) are different; specifically, when the switch 560 is "on" or conducting, the inductor L3 is connected to a ground potential via resistor R38, thereby providing an alternate current path between the nodes 516A and 516B and allowing at least some of the series current 550 to be diverted around the second LED(s) 204. In the circuit of FIG. 4, a duty cycle of the switch 560 as controlled by the IC controller 562, and hence the difference between the first current 552 and the second current 554, is set by the resistor divider network 652 constituted by R41 and R16. In the particular example illustrated in FIG. 4, with R41 at 10 K-Ohms and R16 at 20 K-Ohms, and based on an operating voltage 516 of approximately 80 Volts and a series current 550 of approximately 150 milliamperes, the first current 552 is on the order of 180 milliamperes and the second current 554 is on the order of 120 milliamperes. The foregoing illustrates that the portion of the series current that is diverted from the second LED(s) is not lost, but recycled, in that it is diverted to the storage element (inductor L3) and dumped (on the next half of the cycle) back into the first LED(s), with minimal losses (e.g., 30 milliamperes is deducted from the second current and added to the first current).

The first current 552 and the second current 554 generally determine respective amounts (luminous flux) of the first radiation 503 and the second radiation 505 generated by the first LED(s) and the second LED(s). Accordingly, by appropriate selection of the values of resistors R41 and R16 in FIG. 4, and based on the type and number of LEDs employed for each of the first LED(s) 202 and the second LED(s) 204, a color or color temperature of generated light (based on a mixture of the first radiation and the second radiation) may be set.

Notwithstanding the foregoing, Applicants have recognized and appreciated that the current-to-flux relationship for different types of LEDs varies differently as a function of temperature. This phenomenon may be problematic for some applications involving multiple different types of LEDs in which thermal transients are expected. For example, a system initially at some ambient temperature that is then powered-up for operation "warms-up" over some thermal transient period during which current begins and continues to flow through the LEDs. Based on an illustrative implementation involving both red LEDs and white LEDs for the respective series-connected loads, as the system continues to warm-up to some thermal steady state, the flux from the red LED(s) changes at a different rate than the flux from the white LED(s) as a function of temperature, causing a noticeable shift in the color temperature of generated light during the thermal transient period; more specifically, at constant respective values for the first and second currents, as the system warms-up the flux from the red LED(s) decreases at a rate faster than the flux from the white LED(s). By way of example, over an approximately twenty minute thermal transient period following initial power-up, the color temperature of generated light may shift (e.g., increase) by as much as 100 Kelvin, due to a decrease in the flux from the red LED(s) as compared to the white LED(s). For some applications this effect is undesirable, especially at lower nominal color temperatures at which the human eye is more sensitive to color shifts.

In view of the foregoing, another embodiment of the present invention is directed to methods and apparatus for compensating color and/or color temperature shifts arising from thermal transients in a lighting apparatus that includes multiple series-connected LED light sources of different types.

Figure 5:
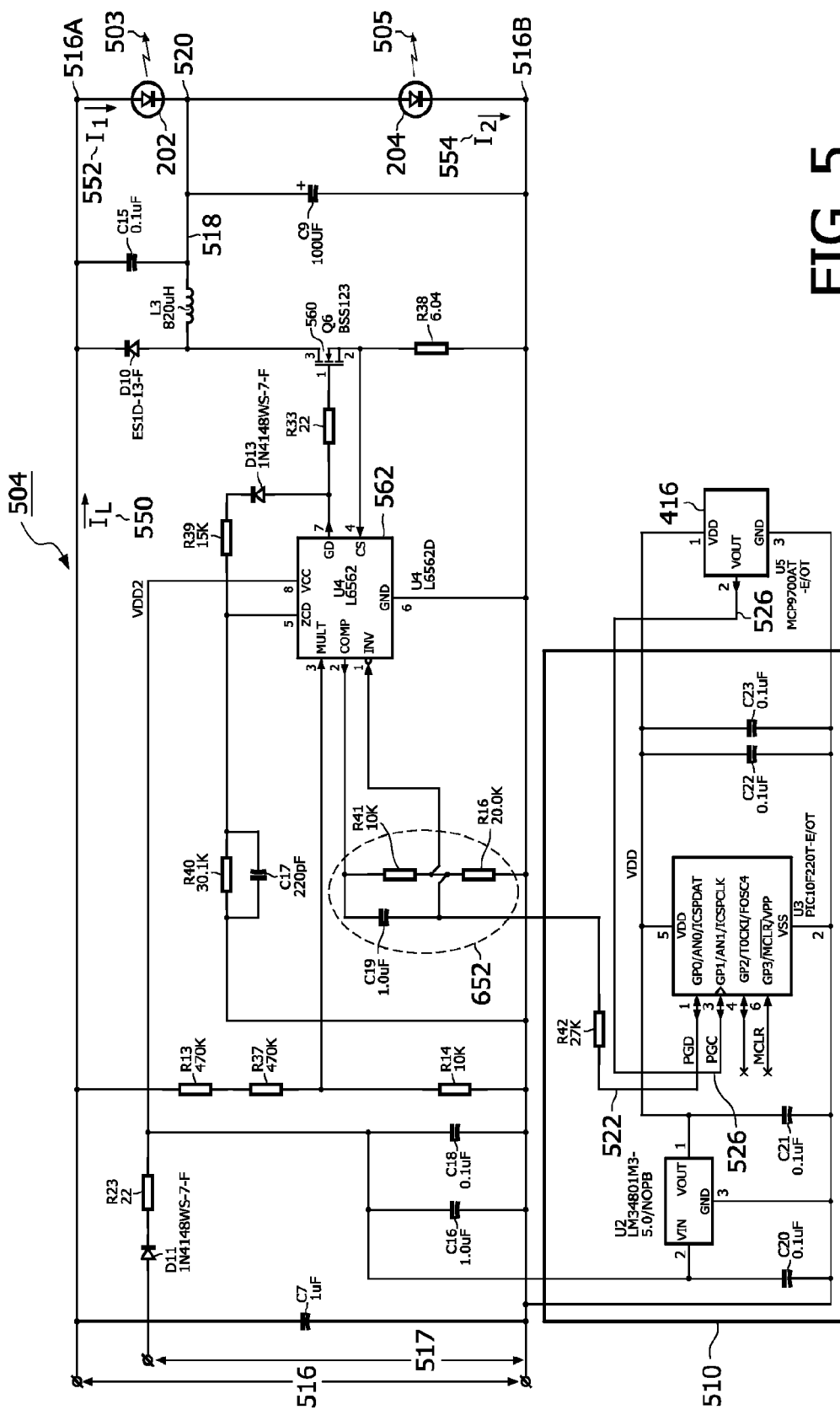
FIG. 5 is a circuit diagram illustrating the load control stage of the power supply shown in FIG. 1, together with an associated controller, according to one embodiment of the present invention.

To this end, FIG. 5 is a circuit diagram illustrating the load control stage 504 of the power supply shown in FIG. 1, together with an associated controller 510, according to another embodiment of the present invention. In one aspect of this embodiment, the controller 510 controls the load control stage 504 in response to a temperature signal 526 received from a temperature sensor 416 disposed proximate to and in thermal communication with the first LED(s) 202 and the second LED(s) 204, so as to provide the thermal compensation functionality noted above. It should be appreciated, however, that this thermal compensation functionality constitutes merely one example of how the controller 510 may be implemented to control various aspects of the load control stage 504, and that parameters or conditions other than the temperature proximate to the LED light sources may be input to and utilized by the controller 510 to affect control of the load control stage 504 (e.g., refer to the discussion above in connection with the external signal 524 shown in FIG. 1).

As shown in FIG. 5, in one exemplary implementation the controller 510 includes an integrated circuit microcontroller U3 that receives operating power from an integrated circuit voltage regulator U2. With respect to compensation for thermal transients, the microcontroller U3 also receives as an input the temperature signal 526 output by the temperature sensor 416 (U5), and provides as an output a control signal 522 that is applied to resistor network/filter 652 of the load control stage 504. In one exemplary implementation, the temperature sensor 416 may be a low-power linear active thermistor integrated circuit, examples of which include the MCP9700/9700A and MCP9701/9701A family of integrated circuits available from Microchip Technology, Inc.

In one exemplary implementation, the controller 510 may provide the control signal 522 to the load control stage 504 in the form of a pulse width modulated (PWM) control signal, the duty cycle of which affects the voltages established by the resistor network/filter 652 of the load control stage 504. Hence, by varying the duty cycle of a PWM control signal 522, the controller 510 may in turn vary a difference between the first current 552 through the first LED(s) 202 and the second current 554 through the second LED(s) 204 and thereby alter the respective fluxes generated by the different LED types. By controlling the duty cycle of the PWM control signal 522 in response to the temperature signal 526, the controller 510 may effectively provide compensation for shifts in color or color temperature of generated light during thermal transients (e.g., due to different temperature-dependent current-to-flux relationships for different types of LEDs).

Figure 6:
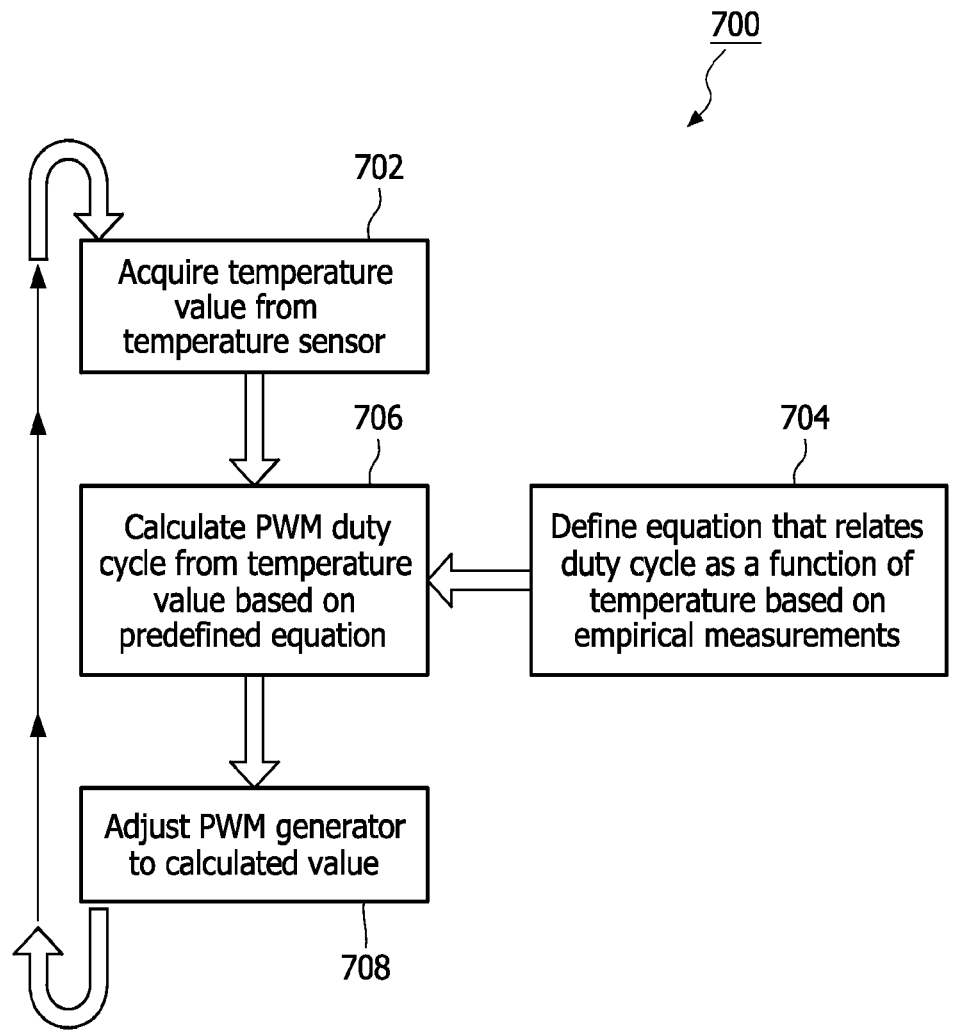
FIG. 6 illustrates a flow diagram showing a temperature compensation method implemented by the controller of FIG. 5 for controlling the load control stage, according to one embodiment of the present invention.

FIG. 6 illustrates a flow diagram showing a method 700 implemented by the controller 510 for adjusting a duty cycle of the PWM control signal 522 in response to temperature variations represented by the temperature signal 526, according to one embodiment of the present invention. In one aspect of the method 700, as indicated in block 704, a relationship (e.g., equation) is defined a priori that relates the duty cycle of the PWM control signal 522 to temperature variations represented by the temperature signal 526. Once such a relationship is defined, as illustrated in FIG. 6, the controller 510 acquires (block 702) a temperature value from the temperature sensor 416, as represented by the temperature signal 526, and calculates (block 706) the duty cycle as a function of measured temperature based on the predefined relationship/equation (block 704). The controller 510 then adjusts the duty cycle of the PWM control signal 522 to the newly calculated value (block 708), and the method returns to the block 702 for reiteration.

With respect to the relationship in block 704 that specifies duty cycle as a function of temperature for the PWM control signal 522, this relationship may be empirically determined during a calibration procedure, an example of which is discussed in detail below. Such a relationship may be modeled as a linear, piece-wise linear, or nonlinear relationship, depending at least in part on the degree of compensation desired for a given application. In one exemplary model, the relationship is dictated by a linear equation (in which various parameters of the equation are determined empirically), given by:

$$\text{PWM Duty Cycle} = [\text{Ambient Temp Duty Cycle}] - [(\text{Temp Reading}) - \text{Ambient Temp})]*[\text{Slope}]. \quad (\text{Eq. 1})$$

In Eq. 1, "PWM Duty Cycle" refers to the duty cycle of the control signal 522 calculated in block 706 of FIG. 6, the "Ambient Temp Duty Cycle" is the duty cycle of the control signal 522 at which the first and second currents provide a desired target color temperature for the generated light when the LEDs 202 and 204 are at ambient temperature, the "Temp Reading" is the temperature represented by the temperature signal 526 (as acquired in block 702 of FIG. 6), the "Ambient Temp" is the ambient temperature (e.g., prior to power-on), and the "Slope" is the change in duty cycle per change in temperature.

In one exemplary implementation, all of the values represented in Eq. (1) are converted to a binary value between 0 and 255 (so that they each may be processed by the microcontroller U3 of the controller 510 as an 8-bit data word). With respect to the duty cycle values, a binary value of 255 represents 100% (i.e., a binary value of 128 represents an approximately 50% duty cycle). With respect to the "Temp Reading" and "Ambient Temp" parameters, in one example temperature in degrees Celsius is converted according to: floor ([(Temperature [° C.]*0.01+0.414)/5]*255).

In an exemplary calibration procedure to facilitate determination of the various parameters of Eq. (1), one aspect of the procedure involves varying the duty cycle of the PWM control signal 522 over some exemplary range and measuring the first current 552 and the second current 554. Table 1 below provides and example of such measurements.

TABLE 1

| Duty Cycle (%) | First Current (mA) | Second Current (mA) |
| --- | --- | --- |
| 12.5 | 177 | 122 |
| 25 | 168 | 124 |
| 50 | 155 | 128 |
| 62.5 | 150 | 130 |
| 75 | 145 | 130 |

Another aspect of the calibration procedure involves measuring the color temperature of generated light as a function of various first and second currents applied to the respective first and second LEDs. This process involves a sequence of "instant-on" photometric tests, in which two separate known current sources are respectively connected to the first LED(s) and the second (LEDs) for a relatively short period of time and the color temperature of generated light is measured within a few seconds of the currents being applied. The currents are then immediately turned off long enough so that the LEDs are maintained at an ambient thermal steady state before applying another pair of currents. In one exemplary implementation in which red LED(s) are employed as the first LED(s) and white LED(s) are employed as the second LED (s), it may be assumed that the red flux varies more than the white flux, and hence a nominal value may be chosen for the second current while the first current is varied. Table 2 below provides one example of such a measurement process.

TABLE 2

| Second (white) Current (mA) | First (red) Current (mA) | Correlated Color Temperature (° K) |
|---|---|---|
| 130 | 150 | 2994 |
| 130 | 160 | 2853 |
| 130 | 170 | 2175 |
| 130 | 180 | 2777 |

Based on the measurement process exemplified in Table 2, a nominal target operating color temperature may be selected for the generated light. Based on this target color temperature, the corresponding first and second currents required (from Table 2) are matched to similar first and second currents in Table 1 to determine the "Ambient Temp Duty Cycle" for Eq. (1). For example, if the target color temperature is 3000 Kelvin, from Table 2 this corresponds to a first current of 150 mA and a second current of 130 mA at ambient temperature, which from Table 1 in turn corresponds to a duty cycle for the PWM control signal 522 of 62.5%. Thus, the "Ambient Temp Duty Cycle" in this example for Eq. (1) would have a binary value of 62.5% (255)=159.

A final aspect of the calibration procedure to facilitate determination of the various parameters in Eq. (1) involves a determination of the "Slope" term. Again, the "Slope" term represents the change in duty cycle per change in temperature required to maintain a sufficiently stable color and/or color temperature of generated light during a thermal transient such as a warm-up period following power-on. In one example, a determination of an appropriate slope term may include choosing an initial seed value for the "Slope" term, iterating the method 700 over an estimated thermal transient period (e.g., twenty to thirty minutes), making periodic measurements (e.g., every thirty seconds) of the color temperature of generated light, and plotting these color temperature measurements vs. time. This process may be repeated using a different value for the "Slope" term until an appropriate value is found that results in the flattest color temperature vs. time plot.

Figure 7:
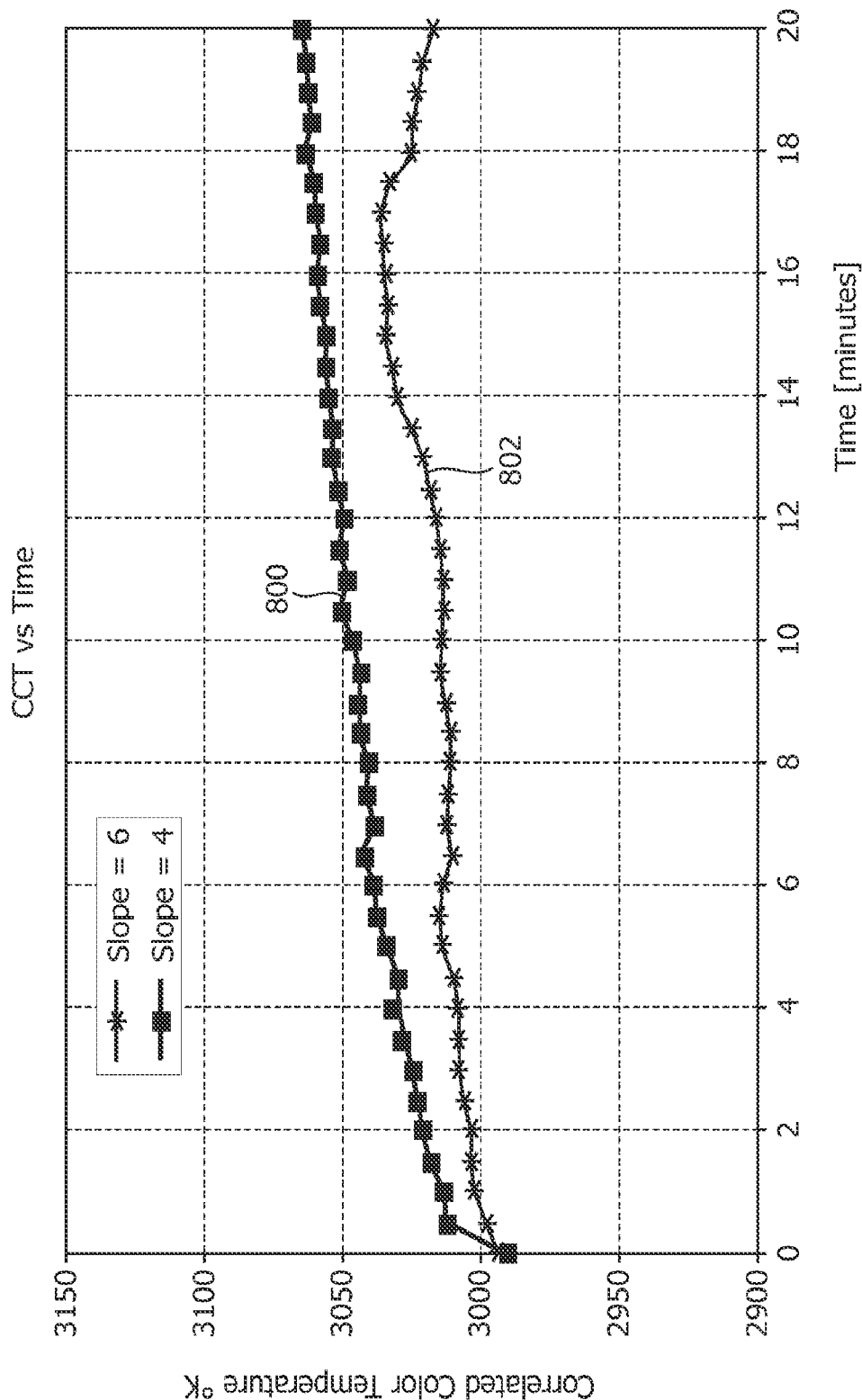
FIG. 7 illustrates two plots of color temperature of generated light vs. time based on the temperature compensation method of FIG. 6, according to one embodiment of the present invention.

FIG. 7 provides two such exemplary plots based on an "Ambient Temp Duty Cycle" binary value of 159 (representing a target color temperature of 3000 Kelvin), and an "Ambient Temp" binary value of 38 (representing an ambient temperature of 25 degrees Celsius). A first plot 800 is generated using a "Slope" term having a binary value of 4 and a second plot 802 is generated using a "Slope" term having a binary value of 6. From FIG. 7, it may be readily observed that, in this example, a "Slope" term having a binary value of 6 results in a significantly flatter color temperature vs. time plot during the thermal transient period. Thus, by employing the equation:

PWM Duty Cycle=[159]−[(Temp Reading)−38)]*[6]

In block 704 of the method 700 shown in FIG. 6, for this particular example, the controller 510 implementing the method 700 effectively compensates for the thermal transient and provides a stable color temperature of approximately 3000 Kelvin throughout the thermal transient (e.g., "warm-up") period.

It should be appreciated that the general outline of the foregoing calibration procedure may be applied to other types of LED sources and/or other color temperature ranges of interest to effectively implement the temperature compensation functionality of the controller 510 shown in FIG. 5. In particular, it should be appreciated that in some instances, using exactly the same hardware, two identical luminaires may be configured to provide significantly different colors and/or color temperatures of white light merely by selecting a different value for the "Ambient Temp Duty Cycle" term in Eq. (1) above. Additionally, the "Ambient Temp Duty Cycle" term in Eq. (1) may in some implementations be a predetermined function of time (e.g., to compensate for gradual aging of the LEDs and flux depreciation over time). Furthermore, as noted above, the particular relationship employed in block 704 of the method 700 shown in FIG. 6 may be modeled as a linear relationship as in Eq. (1) above, or alternatively as a piece-wise linear or nonlinear relationship, depending at least in part on the degree of compensation desired for a given application).

Figure 8:
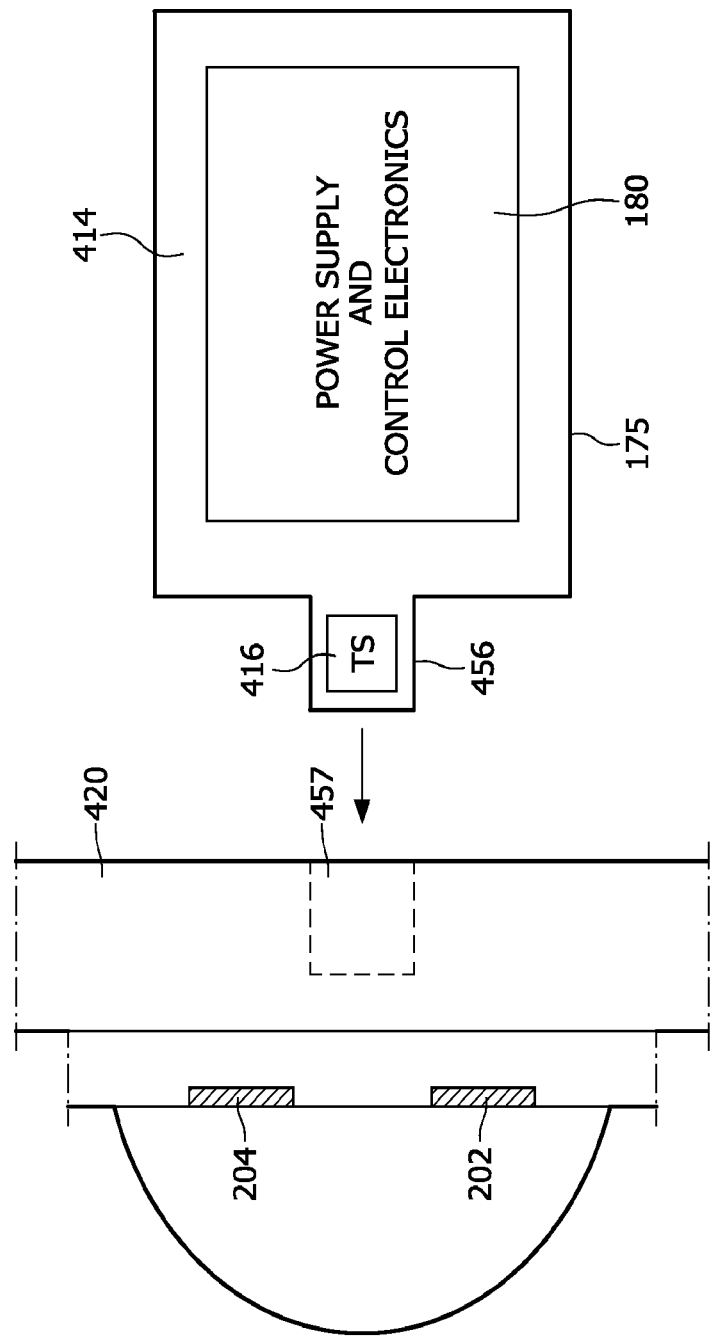
FIG. 8 illustrates an exemplary configuration of a printed circuit board on which is disposed the power supply of FIG. 1, and a coupling of the printed circuit board to a substrate carrying LED loads, according to one embodiment of the invention.

FIG. 8 illustrates an exemplary configuration of a printed circuit board 175 on which is disposed a plurality of components 180 constituting the power supply 414, together with the temperature sensor 416, according to one embodiment of the invention. FIG. 8 also shows a substrate 420 (e.g., the heat sink shown in earlier figures) carrying the first LED(s) 202 and the second LED(s) 204. The arrangement shown in FIG. 8 facilitates a thermal connection between the temperature sensor 416 and the LEDs, and therefore efficient tracking of the LED temperature (e.g., for purposes of providing color and/or color temperature stability during a thermal transient). In particular, the first LED(s) 202 and the second LED(s) 204 are mounted to a thermally conductive substrate 420, which has a recess 457 formed therein, proximate to the LED(s) 202 and 204. The printed circuit board 175 has a tab 456 for insertion into the recess 457; to this end, although the particular view of FIG. 8 illustrates a primarily rectangular tab and rectangular recess, it should be appreciated that the tab 456 may have any of a variety of shapes and dimensions, with the recess 457 being complimentarily formed so as to accommodate the tab. The temperature sensor 416 is disposed on the tab of the printed circuit board, such that when the printed circuit board 175 is inserted into the recess 457, the temperature sensor is essentially embedded in the thermally conductive substrate proximate to the LEDs. As discussed above in connection with FIGS. 1-5, the power supply 414 may include multiple stages based on multiple transition mode controllers, and a plurality of circuit components constituting the power supply 414 may be appropriately disposed on the printed circuit board 175.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the Manual of Patent Examining Procedures, Section 2111.03, issued by the United States Patent Office.

The invention claimed is:

1. A lighting apparatus, comprising:
   at least one first LED for generating first radiation having a first spectrum;
   at least one second LED for generating second radiation having a second spectrum different from the first spectrum, wherein the at least one first LED and the at least one second LED are electrically connected in series between a first node and a second node, and a series current flows between the first node and the second node when an operating voltage is applied across the first node and the second node;
   a controllable current path connected in parallel with the at least one second LED, the controllable current path including an energy storage device and a switch; and
   a switching power supply for providing power factor correction and the operating voltage, the switching power supply controlling the switch of the controllable current path to selectively divert at least a portion of the series current around the at least one second LED to the energy storage device, such that a first current through the at least one first LED and a second current through the at least one second LED are different,
   wherein the energy storage device subsequently provides the diverted portion of the series current to the at least one first LED.

2. The lighting apparatus of claim 1, wherein:
   the at least one first LED includes a first number of series-connected red LEDs; the at least one second LED includes a second number of series-connected white LEDs, wherein the first number and the second number are different; and
   the controllable current path is connected in parallel with the second number of series-connected white LEDs.

3. The lighting apparatus of claim 2, wherein the switching power supply controls the controllable current path so as to set a color temperature of light resulting from a mixture of the first radiation and the second radiation.

4. The lighting apparatus of claim 1, further comprising:
   at least one temperature sensor for generating a temperature signal, the at least one temperature sensor disposed proximate to and in thermal communication with the at least one first LED and the at least one second LED,
wherein the switching power supply comprises:
a first controller for receiving the temperature signal and providing a first control signal for controlling the controllable current path based at least in part on the temperature signal.

5. The lighting apparatus of claim 4, wherein the first control signal includes a pulse width modulated (PWM) control signal, and wherein the first controller varies a duty cycle of the PWM control signal in response to the temperature signal.

6. The lighting apparatus of claim 5, wherein the first controller determines the duty cycle of the PWM control signal based on a predetermined relationship between the duty cycle and the temperature represented by the temperature signal.

7. The lighting apparatus of claim 6, wherein the predetermined relationship is a linear relationship.

8. The lighting apparatus of claim 4, wherein the switching power supply further comprises:
a power factor correction stage for receiving an A.C. input voltage and providing the power factor correction and the operating voltage; and
a load control stage comprising:
the switch disposed in the controllable current path; and an integrated circuit (IC) controller coupled to the switch, wherein the IC controller receives the first control signal from the first controller and controls the switch in response to the first control signal.

9. The lighting apparatus of claim 1, wherein the switching power supply comprises:
a power factor correction stage for receiving an A.C. input voltage (514) and providing the power factor correction and the operating voltage; and
a load control stage comprising:
the switch disposed in the controllable current path; and an integrated circuit (IC) controller coupled to the switch, wherein the IC controller controls the switch using a fixed off time (FOT) control technique, and wherein the IC controller does not have any input that receives a signal relating to the operating voltage.

10. The lighting apparatus of claim 8, wherein the switching power supply further comprises:
a second controller coupled to the power factor correction stage for providing a second control signal to the power factor correction stage so as to control at least one of the operating voltage and a power provided by the power factor correction stage based on at least one voltage or current parameter associated with the power factor correction stage, a frequency of the A.C. input voltage, or an external signal.

11. A method for controlling a color temperature of white light generated by an LED-based lighting apparatus during a thermal transient, the LED-based lighting apparatus comprising at least one first LED for generating first radiation having a first spectrum and at least one second LED for generating second radiation having a second spectrum different from the first spectrum, wherein the white light results from a mixture of the first radiation and the second radiation, and wherein the at least one first LED and the at least one second LED are electrically connected in series between a first node and a second node and a series current flows between the first node and the second node when an operating voltage is applied across the first node and the second node, the method comprising:

A) generating a temperature signal representing a temperature proximate to the at least one first LED and the at least one second LED;
B) controlling, based on the temperature signal, at least one controllable current path connected in parallel with the at least one second LED so as to divert at least a portion of the series current around the at least one second LED, such that a first current through the at least one first LED and a second current through the at least one second LED are different; and
C) recycling the at least a portion of the series current diverted around the at least one second LED back to the at least one first LED.

12. The method of claim 11, wherein B) comprises:
B1) generating a pulse width modulated (PWM) control signal;
B2) varying a duty cycle of the PWM control signal in response to the temperature signal; and
B3) controlling the at least one controllable current path based on the PWM control signal.

13. The method of claim 12, wherein B2) comprises:
B2a) determining the duty cycle of the PWM control signal based on a predetermined relationship between the duty cycle and the temperature represented by the temperature signal.

14. The method of claim 13, wherein the predetermined relationship is a linear relationship.

15. The method of claim 13, wherein B2a) comprises deriving the predetermined relationship by:
B2a-1) measuring the first current and the second current at a plurality of different duty cycles of the PWM control signal;
B2a-2) measuring, at an ambient temperature, a plurality of color temperatures of the white light generated by the lighting apparatus at a plurality of current value pairs for the first current and the second current;
B2a-3) determining an ambient temperature duty cycle for a desired color temperature of the white light based on B2a-1) and B2a-2);
B2a-4) determining a value corresponding to a change in the duty cycle per change in the temperature represented by the temperature signal; and
B2a-5) offsetting the ambient temperature duty cycle by an amount related to the value determined in B2a-4).

16. An apparatus for controlling a color temperature of white light generated by an LED-based light source during a thermal transient, the LED-based light source mounted to a thermally conductive substrate and comprising at least one first LED for generating first radiation having a first spectrum and at least one second LED for generating second radiation having a second spectrum different from the first spectrum, wherein the white light results from a mixture of the first radiation and the second radiation, the thermally conductive substrate having a recess formed therein proximate to the LED-based light source, the apparatus comprising:
a printed circuit board defining a protruding tab for insertion into the recess formed in the thermally conductive substrate;
a temperature sensor disposed on the tab of the printed circuit board, such that when the tab is inserted into the recess formed in the thermally conductive substrate, the temperature sensor is essentially embedded in the thermally conductive substrate proximate to the LED-based light source; and
a plurality of components disposed on the printed circuit board and constituting a switching power supply for providing power factor correction and an operating voltage for the LED-based light source, the switching power supply comprising at least one integrated circuit (IC) controller for controlling flow of a first current through the at least one first LED and flow of a second current through the at least one second LED.

17. The apparatus of claim 16, wherein the at least one first LED and the at least one second LED are electrically connected in series between a first node and a second node and a series current flows between the first node and the second node when the operating voltage is applied across the first node and the second node, and wherein the switching power supply comprises:

at least one controllable current path connected in parallel with the at least one second LED so as to at least partially divert the series current around the at least one second LED, such that the first current through the at least one first LED and the second current through the at least one second LED are different.

18. The apparatus of claim 17, wherein the temperature sensor generates a temperature signal, and wherein the switching power supply further comprises:

a first controller for receiving the temperature signal and providing a first control signal for controlling the at least one controllable current path based at least in part on the temperature signal.

19. The lighting apparatus of claim 1, wherein the energy storage device subsequently provides the diverted portion of the series current to the at least one first LED during a next half of a duty cycle of the switch.

* * * * *